US009910725B2

(12) United States Patent
Kritt et al.

(10) Patent No.: US 9,910,725 B2
(45) Date of Patent: Mar. 6, 2018

(54) ERROR-SPECIFIC ADVERTISEMENT DISPLAY IN ELECTRONIC DEVICE

(71) Applicant: International Business Machines Corporation, Armonk, NY (US)

(72) Inventors: Barry A. Kritt, Raleigh, NC (US); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/470,612

(22) Filed: Mar. 27, 2017

(65) Prior Publication Data
US 2017/0199780 A1 Jul. 13, 2017

Related U.S. Application Data

(63) Continuation of application No. 13/243,595, filed on Sep. 23, 2011, now Pat. No. 9,691,081.

(51) Int. Cl.
| | |
|---|---|
| *G06Q 30/00* | (2012.01) |
| *G06F 11/07* | (2006.01) |
| *G06Q 30/02* | (2012.01) |
| *H03M 13/09* | (2006.01) |

(Continued)

(52) U.S. Cl.
CPC ...... *G06F 11/0766* (2013.01); *G06F 11/0703* (2013.01); *G06F 11/0793* (2013.01); *G06Q 30/0254* (2013.01); *G06Q 30/0255* (2013.01); *H03M 13/09* (2013.01); *H04L 29/08072* (2013.01); *H04L 43/0823* (2013.01)

(58) Field of Classification Search
None
See application file for complete search history.

(56) References Cited

U.S. PATENT DOCUMENTS

| 6,202,087 B1 | 3/2001 | Gadish |
| 7,715,448 B2 | 5/2010 | Cheng et al. |
| 7,873,003 B2 | 1/2011 | Baek et al. |

(Continued)

FOREIGN PATENT DOCUMENTS

JP 2008061139 3/2008

OTHER PUBLICATIONS

U.S. Appl. No. 13/243,595, filed Sep. 23, 2011, Final Office Action dated Aug. 21, 2013.

(Continued)

*Primary Examiner* — Alvin L Brown
(74) *Attorney, Agent, or Firm* — Kunzler, PC.

(57) ABSTRACT

A method includes determining that an error has occurred. The error includes a hardware error in a computer, a network error in a network connected to the computer and/or a software error for software executing on the computer. The computer determines that the error has occurred. The method includes identifying a type of computer system in which the error has occurred. The computer system type includes a manufacturer and/or a brand for the computer. The method includes identifying, in response to determining that the error has occurred, an advertisement for a product or service relating to resolution of the error and to the type of computer system. The computer identifies the advertisement and generates an error message. The error message includes the advertisement and information regarding the error. The computer displays the error message with the advertisement on an electronic display connected to the computer.

10 Claims, 4 Drawing Sheets

(51) Int. Cl.
*H04L 12/26* (2006.01)
*H04L 29/08* (2006.01)

(56) References Cited

U.S. PATENT DOCUMENTS

| | | |
|---|---|---|
| 2003/0223411 A1 | 12/2003 | de la Fuente |
| 2005/0033593 A1 | 2/2005 | Abrams |
| 2007/0156522 A1 | 7/2007 | Carpenter et al. |
| 2007/0266150 A1 | 11/2007 | Lee et al. |
| 2008/0184133 A1 | 7/2008 | Lee |
| 2008/0195483 A1 | 8/2008 | Moore |
| 2010/0017280 A1 | 1/2010 | Davis et al. |
| 2011/0035284 A1 | 2/2011 | Moshfeghi |
| 2011/0087916 A1 | 4/2011 | Yoo |
| 2011/0218862 A1 | 9/2011 | Langston et al. |
| 2011/0288917 A1 | 11/2011 | Wanek |
| 2011/0295637 A1 | 12/2011 | Abrams |
| 2012/0316957 A1 | 12/2012 | Zhou |
| 2015/0058108 A1 | 2/2015 | Winters et al. |

OTHER PUBLICATIONS

U.S. Appl. No. 13/243,595, filed Sep. 23, 2011, Final Office Action dated Oct. 6, 2015.
U.S. Appl. No. 13/243,595, filed Sep. 23, 2011, Office Action dated Mar. 31, 2015.
U.S. Appl. No. 13/243,595, filed Sep. 23, 2011, Notice of Allowance dated Feb. 15, 2017.
U.S. Appl. No. 13/781,675, filed Feb. 28, 2013, Office Action dated Jul. 18, 2014.
U.S. Appl. No. 13/781,675, filed Feb. 28, 2013, Final Office Action dated Dec. 4, 2015.
U.S. Appl. No. 13/781,675, filed Feb. 28, 2013, Final Office Action dated Nov. 7, 2014.
U.S. Appl. No. 13/781,675, filed Feb. 28, 2013, Office Action dated Jul. 10, 2015.

ERROR-SPECIFIC ADVERTISEMENT DISPLAY IN ELECTRONIC DEVICE

BACKGROUND

The present invention relates generally to the field of methods, computer program products and/or computer systems for advertisement display in an electronic device. Specifically, the present invention provides methods, computer program products and/or computer systems for advertisement display in an electronic device wherein the advertisement is specific to an error that has occurred in the electronic device.

BRIEF SUMMARY

According to one embodiment of the present invention, a method, implemented in a computer system, of providing an error-specific advertisement at a client computer is provided. The method may include determining that an error has occurred, identifying an advertisement for a product or a service relating to resolution of the error and/or generating an error message. The error message may include the advertisement and information regarding the error.

In some embodiments of the present invention, the method may further include identifying at least two advertisements for a product or a service relating to resolution of the error and generating a ranking for the at least two advertisements, wherein the advertisement having the highest ranking is the first listed advertisement. Some embodiments of the method may also include determining a location of the client computer and assigning a higher ranking to the advertisement having a point of purchase location closest to the location of the client computer.

Additionally and/or alternatively, some embodiments may include a method, wherein the advertisement includes an option to purchase the product or service online. Additionally and/or alternatively, the method may include accepting a user selection of the advertisement and/or connecting the client computer to an online chat service provider.

According to another embodiment of the present invention, a method, implemented in a computer system, of providing an error-specific advertisement at a client computer is provided. The method may include identifying a characteristic of an error that has occurred, identifying an advertisement for a product or a service relating to the identified characteristic and/or generating an error message. The error message may include the advertisement and information regarding the error. In some embodiments of the present invention, the method may also include displaying a dialogue box, the dialogue box including the error message.

According to another embodiment of the present invention, a computer program product for providing an error-specific advertisement to a client computer, may include a computer readable storage medium having computer readable program code embodied therewith. The computer readable program code, when read by a processor, may be configured to determine that an error has occurred, identify an advertisement for a product or a service relating to resolution of the error and/or generate an error message, the error message including the advertisement and information regarding the error. Some embodiments of the computer program product may further include computer readable program code, when read by a processor, which may be configured to access a GPS system to determine the location of the client computer.

In yet another embodiment of the present invention, a computer is provided. The computer may include a processor, a memory and/or an error-specific advertisement program including a plurality of instructions stored in the memory. The plurality of instructions may be executed by the processor to determine that an error has occurred, identify an advertisement for a product or a service relating to resolution of the error and/or generate an error message, the error message including the advertisement and information regarding the error.

For some embodiments of the computer, the plurality of instructions may further include instructions to identify at least two advertisements for a product or a service relating to resolution of the error and generate a ranking for the at least two advertisements. Additionally and/or alternatively, the plurality of instructions may further include instructions to determine a location of the client computer and assign a higher ranking to the advertisement having a point of purchase location closest to the location of the client computer. Additionally and/or alternatively, the plurality of instructions may further include instructions to access a GPS system to determine the location of the client computer. Additionally and/or alternatively, the plurality of instructions may further include instructions to accept a user selection of an advertisement, accept a user feedback regarding the selected advertisement and/or adjust the ranking for the selected advertisement in response to the user feedback.

DETAILED DESCRIPTION OF THE INVENTION

Figure 1:
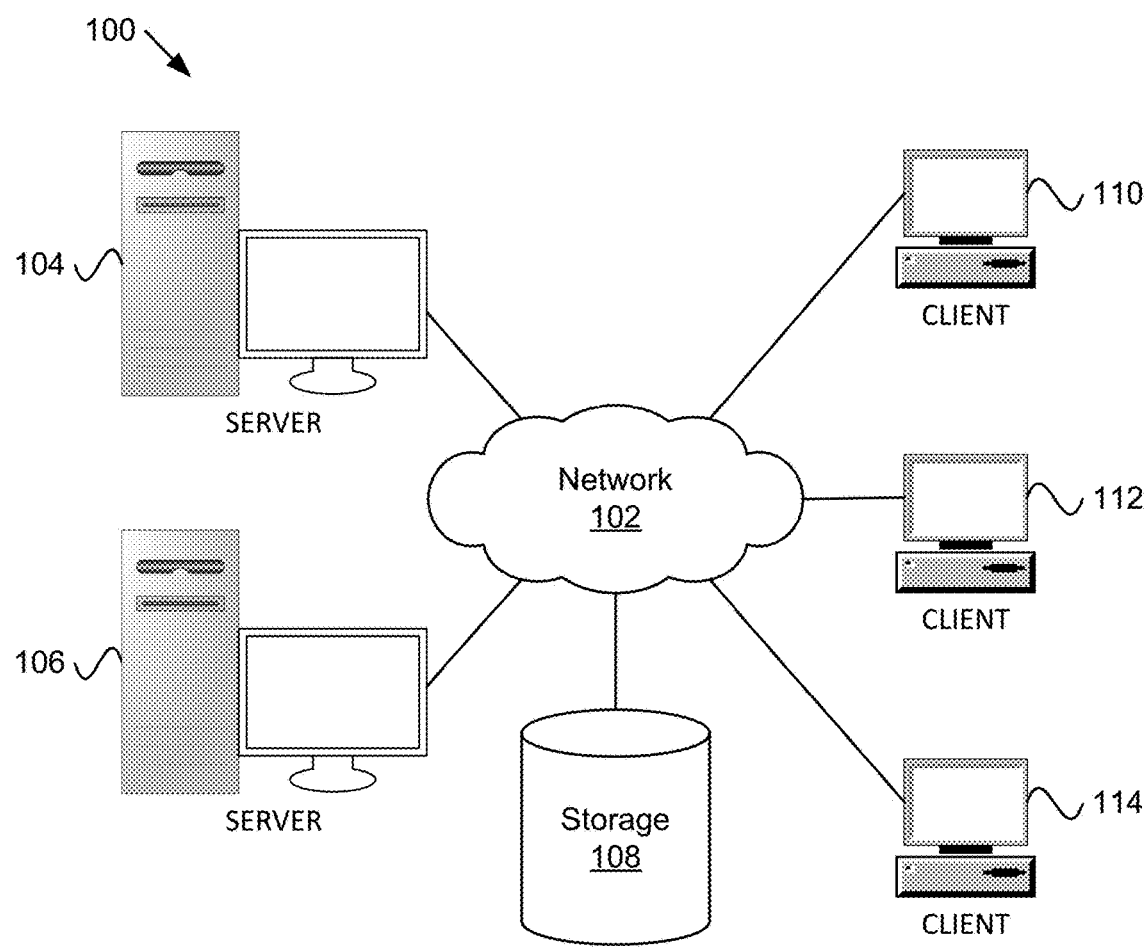
FIG. 1 is a pictorial representation of an example of a computer system in which illustrative embodiments may be implemented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
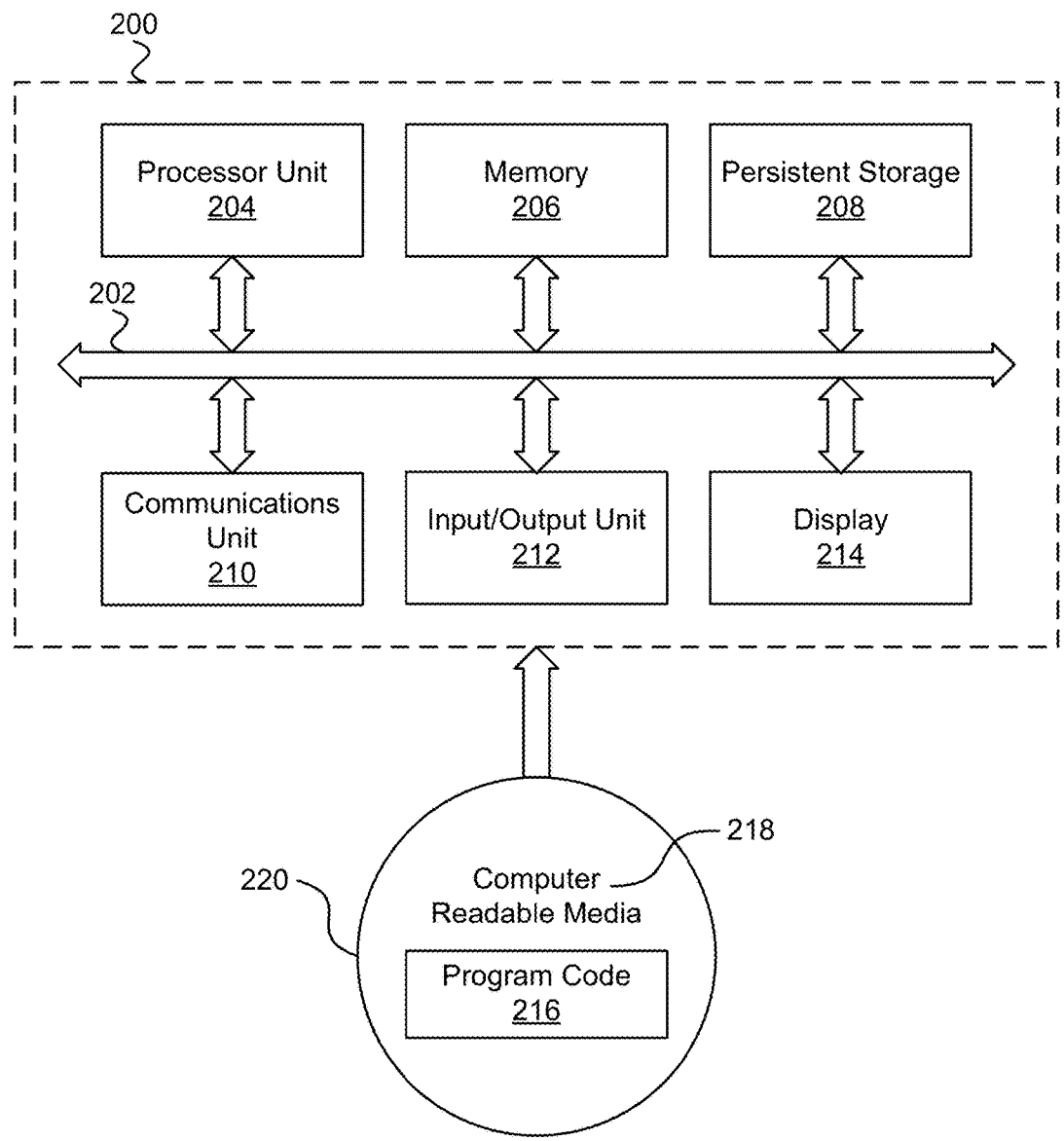
FIG. 2 is a block diagram of an example of a computer in which illustrative embodiments may be implemented.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a computer system, indicated generally at 100, and including a network of computers in which illustrative embodiments may be implemented. Computer system 100 may contain a network 102, which is the medium used to provide communications links between various devices and computers connected together within computer system 100. Network 102 may include connections, such as wire, wireless communication links, or fiber optic cables.

In the depicted example, a server 104 and a server 106 may connect to network 102 along with a storage unit 108. In addition, a first client computer 110, a second client computer 112, and a third client computer 114 may connect to network 102. Client computers 110, 112, and 114 may be, for example, personal computers or network computers. In the depicted example, server 104 may provide data, such as boot files, operating system images, and/or software applications to client computers 110, 112, and 114. Client computers 110, 112, and 114 are clients to server 104 in this example. Computer system 100 may include additional servers, clients, and other devices not shown, or may include fewer devices than those shown.

In the depicted example, network 102 may be or may include the Internet. Computer system 100 also may be implemented with a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of a data processing system is shown in which illustrative embodiments may be implemented. Data processing system 200 is an example of a computer or a computer system, such as a server, client computer, gaming system, personal digital assistant (PDA), smart phone, or any other computer or device that functions like a computer, in which computer-usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 may serve to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices. A storage device may include any piece of hardware that is capable of storing information either on a temporary basis and/or a permanent basis. Memory 206 may include, for example, a random-access memory or any other suitable volatile or non-volatile storage device. Persistent storage 208 may take various forms depending on the particular implementation. For example, persistent storage 208 may contain one or more components or devices. For example, persistent storage 208 may include a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210 may provide for communications with other data processing systems or devices and/or one or more networks such as a local area network (LAN), a general wide area network (WAN), and/or a public network (e.g., the Internet). Some embodiments of communications unit 210 may include a network interface card. Communications unit 210 may provide communications through the use of either or both physical and wireless communications links.

Input/output unit 212 may allow for input and output of data with other devices that may be connected to data processing system 200. For example, input/output unit 212 may provide a connection for user input through a keyboard and mouse. Further, input/output unit 212 may send output to a printer. Display 214 may provide a mechanism to display information to a user.

Instructions for the operating system and applications or programs may be located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer-usable program code, or computer-readable program code that may be read and executed by a processor in processor unit 204. The program code in the different embodiments may be embodied on different physical or tangible computer-readable media, such as memory 206 or persistent storage 208.

Program code 216 may be located in a functional form on computer-readable media 218 that is selectively removable and may be loaded onto or transferred to data processing system 200 for execution by processor unit 204. Program code 216 and computer-readable media 218 may form computer program product 220. In one example, computer-readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer-readable media 218 also may take the form of a persistent storage, such as a hard drive, a thumb drive, or a flash memory that is connected to data processing system 200. The tangible form of computer-readable media 218 is also referred to as computer-recordable storage media. In some instances, computer-recordable media 218 may not be removable.

Alternatively, program code 216 may be transferred to data processing system 200 from computer-readable media 218 through a communications link to communications unit 210 and/or through a connection to input/output unit 212. The communications link and/or the connection may be physical or wireless in the illustrative examples. The computer-readable media also may take the form of non-tangible media, such as communications links or wireless transmissions containing the program code.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. As one example, a storage device in data processing system 200 may include hardware apparatus that may store data. Memory 206, persistent storage 208, and computer-readable media 218 are examples of storage devices in a tangible form.

In another example, a bus system may be used to implement communications fabric 202 and may be comprised of one or more buses, such as a system bus or an input/output bus. The bus system may be implemented using any suitable type of architecture that provides for a transfer of data between different components or devices attached to the bus system. Additionally, a communications unit may include one or more devices used to transmit and receive data, such as a modem or a network adapter. Further, a memory may include, for example, memory 206 or a cache such as found in an interface and memory controller hub that maybe present in communications fabric 202.

A computers or computer system, such as those depicted in FIGS. 1 and 2, may encounter an error during operation. For example, an error may occur or while installing software and/or hardware in the computer. Exemplary errors and/or characteristics of errors may include, but are not limited to, a hardware error, network issue and/or a software error. Exemplary information regarding hardware error and network issue errors may include, for example, a hardware upgrade alert, a un-supported hardware, a RAM requirement alert, a connectivity problem and all other hardware error and network issues known to those skilled in the art. Exemplary information regarding a software error may include, for example, patches are to be installed, a configuration file is missing, a version mismatch, a supported OS Version and all other software error known to those skilled in the art.

Figure 3:
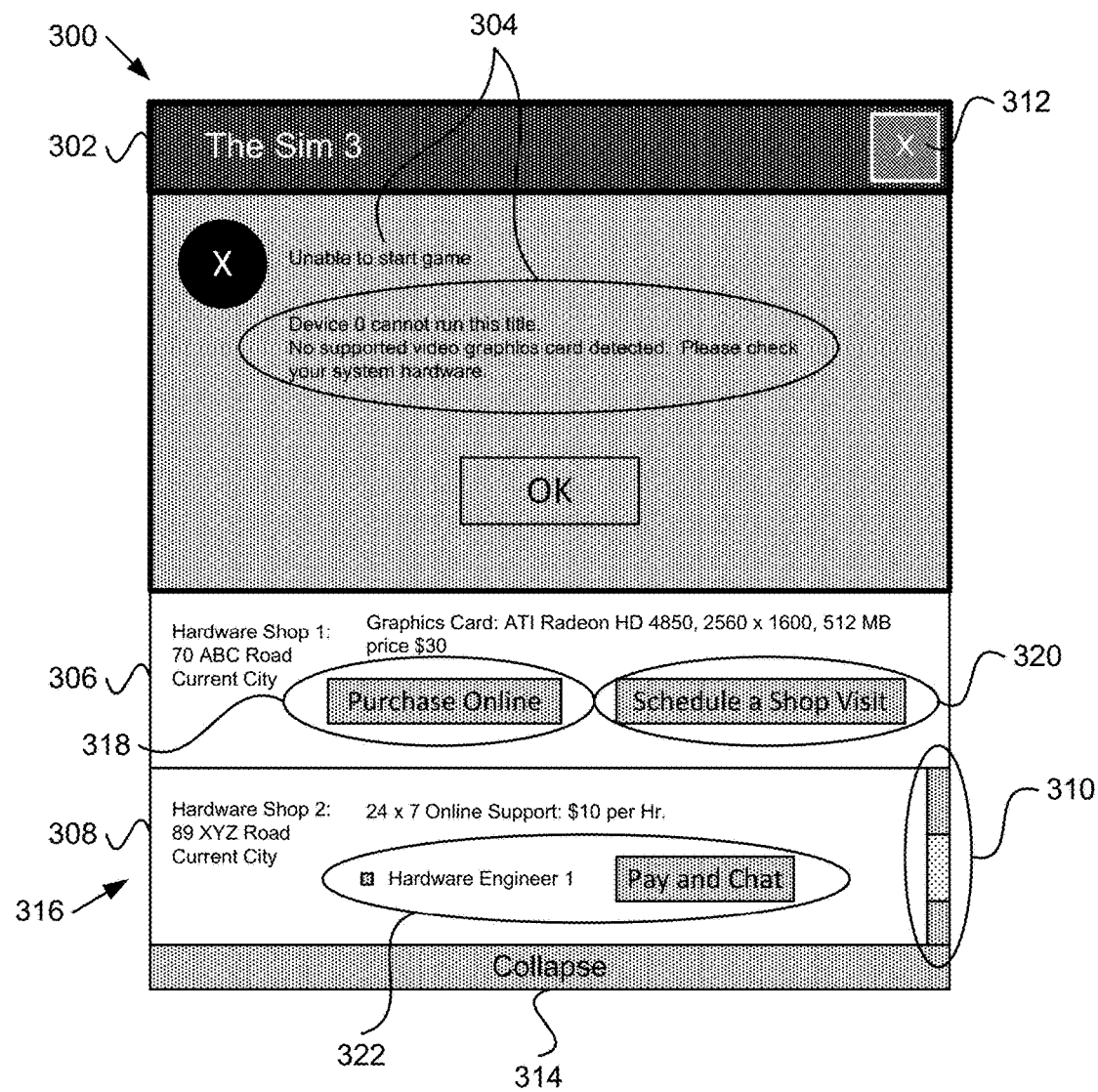
FIG. 3 is an exemplary error message including an advertisement and information regarding an error, in accordance with the present disclosure.

Referring now to FIG. 3, a user may be notified of an error that has occurred via an error message 300. Error message 300 may be displayed in an error dialogue box 302. Error message 300 may include information regarding the error 304 and/or one or more advertisements 306, 308. Both the error 304 and the one or more advertisements 306, 308 may be an integral part of error dialogue box 302. Information regarding the error 304 may include one or more of the type of error that has occurred, a characteristic of the error, a possible resolution of the error and a recommended course of action to resolve the error. The one or more advertisements 306, 308 may be displayed as a list adjacent to and/or below information regarding the error 304. Error message 300 may include a scroll bar 310 to scroll through the list of one or more advertisements.

Error message 300 may further include one or more and one or more message close buttons that may be configured to close all or a portion of the error message. For example, error message 300 may include an error dialogue box close button 312 that may be configured to close error dialogue box 302. Additionally and/or alternatively, error message 300 may include an advertisement section close button 314 that may close or collapse a portion 316 of error dialogue box 302 including the one or more advertisements 306, 308. Close button 314 may also be selected to re-open portion 316.

Advertisement 306, 308 may help the user to find an appropriate solution quickly and an advertiser will be benefitted by the use/purchase of the product or service advertised. Advertisement 306, 308 may include a product or service that relates to a characteristic of the error that has occurred. Additionally and/or alternatively, advertisement 306, 308 may include a product or service that relates to resolution of the error.

Additionally and/or alternatively, advertisement 306, 308 may include a product or service that relates to the type of computer system in which the error has occurred. For example, if an "insufficient memory" error occurred on a Lenovo® laptop computer, advertisement 306, 308 may include a different advertised product (e.g., a memory device) or service, from the situation where an error occurred in an IBM® server or a gaming system. The step of determining the type of computer system may include using an industry standard like the System Management BIOS (SMBIOS), or using a stored user profile.

Additionally and/or alternatively, advertisement 306, 308 may include a product or service that relates to determining and providing a location of the computer in which the error has occurred. The step of determining the location of the computer may include accessing a Global Positioning System. Additionally and/or alternatively, the step of determining the computer location may include accessing a user profile including a user address, or may include looking up a user's IP address to determine the client-computer location.

For example, advertisement 306, 308 may include an address for a vendor and/or a store, a description of the product and/or service being offered and/or one or more options to purchase the product and/or service being offered. For example, advertisement 306, 308 may include an option to purchase on-line 318, wherein user selection of option 318 may connect the user to an online vendor in an Internet browser window for immediate purchase of the product or service over the Internet. Additionally and/or alternatively, advertisement 306, 308 may include an option to schedule an appointment 320, wherein user selection of option 320 may provide the user with a phone number, connect user to a calendar having scheduling capability and/or connect the user to the vendor directly. Additionally and/or alternatively, advertisement 306, 308 may include an option to chat 322. Option to chat 322 may be fee based. Option to chat 322 may include on-line chat, wherein user selection of option 322 may include any kind of communication over the Internet that offers an instantaneous transmission of text-based messages from sender to receiver. Additionally and/or alternatively, option to chat 322 may include voice and video calls and chats over the Internet.

The one or more advertisements may be displayed as a list and/or may be assigned a rank. The rank assigned may determine the placement of the advertisement in the error message. For example, the advertisement having the highest rating may be the first listed advertisement. Ranking of the one or more advertisements may be assigned based on one or more factors including, but not limited to, a user profile, location of the user and/or reputation of a vendor or advertiser.

A user profile may include stored information and/or information entered by the user. The user profile may additionally and/or alternatively include stored patterns of user behavior. For example, the user profile may include that the user prefers branded products and services. Accordingly, an advertisement for a branded product or service may be assigned a high ranking.

Location of the user may be determined via a Global Positioning System and/or the user profile. Additionally and/or alternatively, the location of the user may be determined based upon network Internet Protocol (IP) address information. For example, an advertisement for a product near the current location of the computer may be given a higher ranking if user has to purchase the product physically. Additionally and/or alternatively, an advertisement for a product or service nearby a stored address of the user may be assigned a high ranking.

Reputation of the vendor or advertiser may include a user rating of the vendor or advertiser. For example, an advertisement for a product or service from a vendor or advertiser having a high user rating may be assigned a high ranking. The user rating may be adjusted when additional ratings are received. Additionally and/or alternatively, the user rating may be displayed in or adjacent to advertisement 306, 308.

The following is a description of an alternative embodiment of the invention, which may also be referred to as a high-level implementation method:

A software error dialog box may include a space where advertisement may be displayed. In some embodiments, an advertisement space may be part of the dialog box. An error may be detected in an application. One or more of the following information may be sent to advertisers for appropriate advertisements: location of the machine where the error is found, error message, system configurations. The information may be sent through wired or wireless Internet. An appropriate location based advertisement may be identified and/or may be displayed along with the error message. The user may select the appropriate advertisement according to his or her requirements. In the advertisement, the user may be allowed to provide feedback, and accordingly the advertisement may be assigned a rating and/or a rank.

Figure 4:
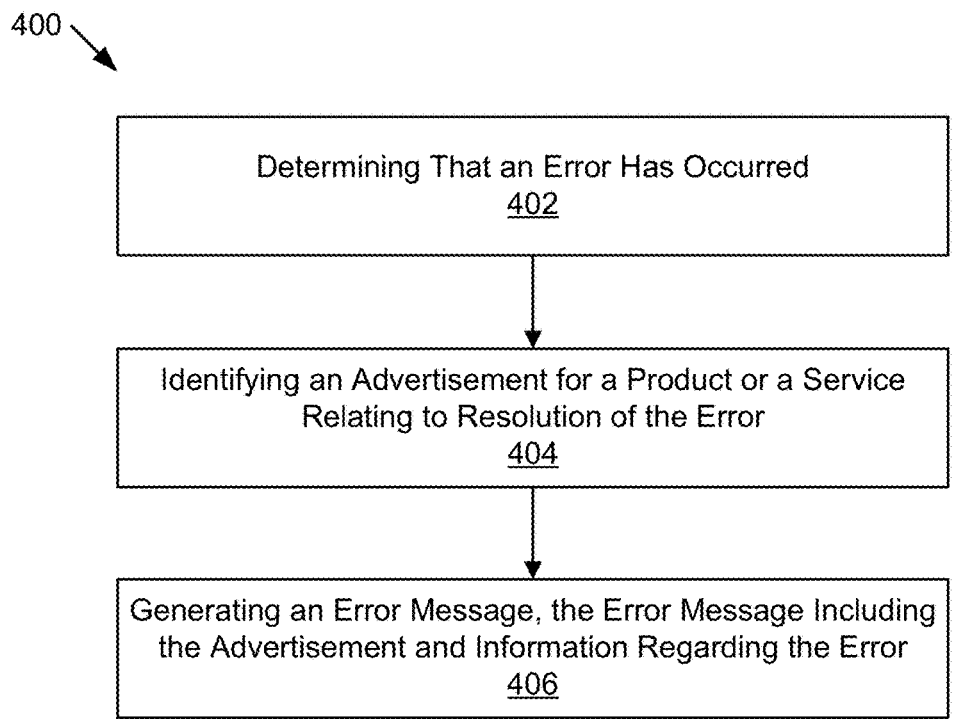
FIG. 4 is an example of a method of providing an error-specific advertisement.

Referring now to FIG. 4, an example of a method, implemented in a computer system, of providing an error-specific advertisement at a client computer is shown. While FIG. 4 shows exemplary steps of a method according to one embodiment, other embodiments may omit, add to, and/or modify any of the steps shown in that figure. Step 402 may include determining that an error has occurred. In step 404, an advertisement for a product or a service relating to resolution of the error may be identified. In step 406, an error message may be generated. The error message may include the advertisement and information regarding the error. In some embodiments, the advertisement may include an option to purchase the product or service online.

Method 400 may additionally and/or alternatively include other steps. For example, method 400 may include identifying at least two advertisements for a product or a service relating to resolution of the error. Method 400 may further include generating a ranking for the at least two advertisements, wherein the advertisement having the highest ranking is the first listed advertisement. Additionally, and/or alternatively, method 400 may include determining a location of the client computer and assigning a higher ranking to the advertisement having a point of purchase location closest to the location of the client computer. Additionally, and/or alternatively, method 400 may include displaying the error message.

Figure 5:
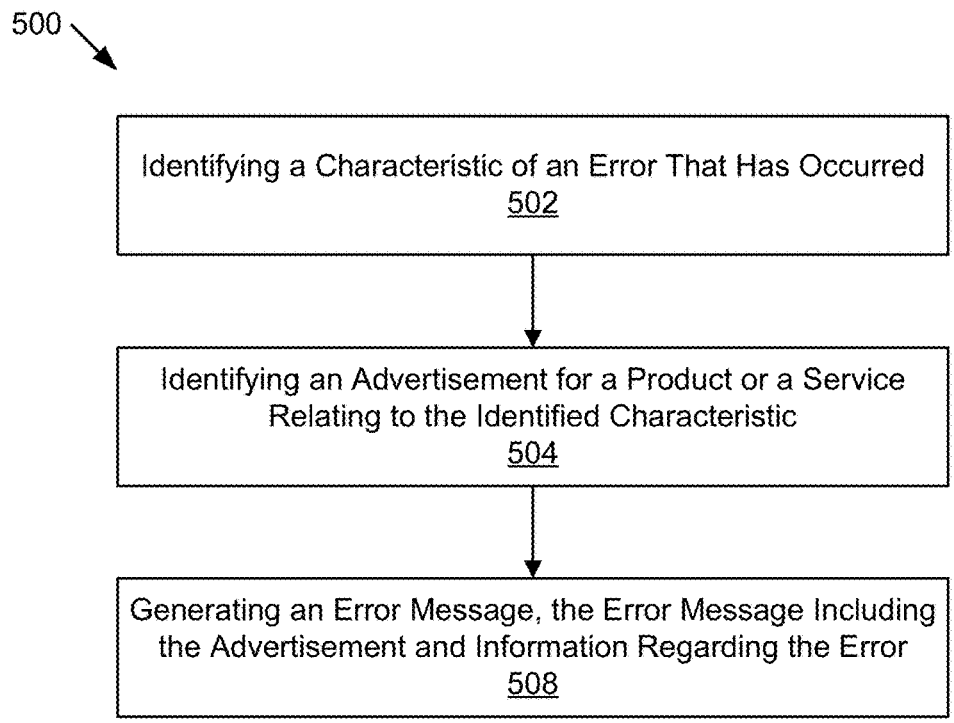
FIG. 5 is a further example of a method of providing an error-specific advertisement.

Referring now to FIG. 5, a further example of a method, implemented in a computer system, of providing an error-specific advertisement is shown. While FIG. 5 shows exemplary steps of a method according to one embodiment, other embodiments may omit, add to, and/or modify any of the steps shown in that figure. In step 502, a characteristic of an error that has occurred may be identified. In step 504, an advertisement for a product or a service relating to the identified characteristic may be identified. In step 506, an error message may be generated. The error message may include the advertisement and information regarding the error.

Method 500 may include other steps. For example, method 500 may include identifying at least two advertisements for a product or a service relating to the identified characteristic. Method 500 may further include generating a ranking for the at least two advertisements, wherein the ranking depends on one or more of user feedback information, user profile information and location of the client computer. Some embodiments of method 500 may include listing the at least two advertisements in the error message, wherein the advertisement having the highest ranking is the first listed advertisement. Additionally and/or alternatively, method 500 may include accessing a GPS system to determine the location of the client computer. Additionally, and/or alternatively, method 500 may include looking up a user's IP address to determine the client-computer location.

Additionally and/or alternatively, method 500 may include accepting a user selection of the advertisement. Method 500 may also include connecting the client computer to an online chat service provider. Additionally and/or alternatively, method 500 may include accepting a user selection of an advertisement, accepting a user feedback regarding the selected advertisement and/or adjusting the ranking for the selected advertisement in response to the user feedback. Additionally and/or alternatively, method 500 may include displaying a dialogue box, the dialogue box including the error message.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of providing an error-specific advertisement at a computer, comprising:
    determining that an error has occurred, the error comprising one or more of a hardware error in a computer, a network error in a network connected to the computer, and a software error for software executing on the computer, wherein the computer determines that the error has occurred;
    identifying a type of computer system in which the error has occurred, the type of computer system comprising one or more of a manufacturer for the computer and a brand for the computer;
    identifying, in response to determining that the error has occurred, an advertisement for a product or a service relating to resolution of the error and to the type of computer system, wherein the computer identifies the advertisement; and
    generating an error message, the error message including the advertisement and information regarding the error, wherein the computer displays the error message with the advertisement on an electronic display connected to the computer wherein the computer determines that the error has occurred and identifies an advertisement prior to an error message related to the error being displayed.

2. The method of claim 1, further comprising:
    identifying at least two advertisements for a product or a service relating to resolution of the error; and
    generating a ranking for the at least two advertisements, wherein the advertisement having the highest ranking is the first listed advertisement.

3. The method of claim 2, further comprising:
    determining a location of the computer; and
    assigning a higher ranking to the advertisement having a point of purchase location closest to the location of the computer.

4. The method of claim 1, wherein the advertisement includes an option to purchase the product or service online.

5. A method of providing an error-specific advertisement, comprising:

identifying a characteristic of an error that has occurred, the error comprising one or more of a hardware error in a computer, a network error in a network connected to the computer, and a software error for software executing on the computer, wherein the computer identifies the error and the characteristic of the error;

identifying a type of computer system in which the error has occurred, the type of computer system comprising one or more of a manufacturer for the computer and a brand for the computer;

identifying, in response to determining that the error has occurred, an advertisement for a product or a service relating to the identified characteristic and to the type of computer system, wherein the computer identifies the advertisement;

generating an error message, the error message including the advertisement and information regarding the error, wherein the computer generates the error message; and displaying the error message, wherein the computer displays the error message with the advertisement on an electronic display connected to the computer wherein the computer determines that the error has occurred and identifies an advertisement prior to an error message related to the error being displayed.

6. The method of claim 5, further comprising:
identifying at least two advertisements for a product or a service relating to the identified characteristic; and
generating a ranking for the at least two advertisements, wherein the ranking depends on one or more of user feedback information, user profile information and location of the computer.

7. The method of claim 6, further comprising:
listing the at least two advertisements in the error message, wherein the advertisement having the highest ranking is the first listed advertisement.

8. The method of claim 5, further comprising:
accepting a user selection of the advertisement; and
connecting the computer to an online chat service provider.

9. The method of claim 5, further comprising:
displaying a dialogue box, the dialogue box including the error message.

10. The method of claim 5, wherein the computer identifies an error characteristic of the error prior to an error message related to the error being displayed.

* * * * *